United States Patent [19]

Spalding

[11] 4,011,505
[45] Mar. 8, 1977

[54] CURRENT MEASURING DEVICE
[75] Inventor: David I. Spalding, Epping, Australia
[73] Assignee: Applied Power Australia Limited, Canberra City, Australia
[22] Filed: Sept. 22, 1975
[21] Appl. No.: 616,166
[52] U.S. Cl. .................................. 324/117R; 324/127
[51] Int. Cl.² ................ G01R 15/02; G01R 33/00
[58] Field of Search ................. 324/127, 117 R; 336/176

[56] References Cited
UNITED STATES PATENTS

| 1,524,285 | 1/1925 | Besag | 324/117 R |
| 3,422,352 | 1/1969 | Paulkovich | 324/127 |
| 3,708,749 | 1/1973 | Bateman et al. | 324/127 |

Primary Examiner—R. V. Rolinec
Assistant Examiner—Ernest Karlsen
Attorney, Agent, or Firm—Frederick E. Lange

[57] ABSTRACT

A current measuring device for measuring a current flowing in a conductor by inductive coupling to the conductor, the device having an E-shaped core of magnetic material and a slidable bar normally spaced by an air gap from one outer leg and being slidably movable away from this outer leg to permit the insertion of the conductor being measured. Two pairs of windings are placed on the other outer leg. One winding in each pair is alternately energized under the control of a transistor oscillator network, the other winding in each pair being used to supply feedback voltages to cause deenergization of the transistor then conducting. Each transistor has in series therewith a second transistor to minimize clipping of the voltage peaks. The output of the windings is applied to the input of a further transistor, the output of which is in turn applied to a current measuring device.

8 Claims, 3 Drawing Figures

CURRENT MEASURING DEVICE

This invention relates to apparatus for measuring a current flowing in a conductor and more particularly to apparatus which responds when inductively coupled to the conductor.

There is frequently a requirement, particularly in the testing of electrical systems of motor vehicles, to measure heavy duty currents without disrupting electrical cables, such as occurs in the insertion of an ammeter shunt. Such a practice is inconvenient and sometimes can influence the resulting analysis. Inductively-coupled sensors have been developed in the past which employ a two-piece ferromagnetic core member which can be attached to enclose the conductor under test. This core carries windings which are excited by an oscillator with the core sometimes forming part of the oscillator resonant circuit. Asymmetry is introduced into the oscillator circuit by induction from the conductor which is detected and indicated on a meter. Several electrical circuits are known which function as the oscillator and it is conventional that an indication of the current flow in the conductor is provided on the scale of an ammeter which responds to current imbalance in the excitation coils on the core.

One known type of ferromagnetic core is U-shaped with a sliding or hinged I-bar pole piece to bridge the two poles of the core. Such a core must be physically large to avoid saturation at the high currents to be expected, while the transmission of an output signal to a remote indicator or data acquisition system may be difficult. Such a prior device has been employed with a circuit with reasonably low power consumption suitable for currents to be measured of up to 100 amperes. Such a circuit may have an oscillator composed of two transistors feeding a constant-voltage square-wave to two exciter coils with an ammeter indicating the current imbalance in these coils. The coil inductance in combination with the base resistance forms the circuit time-constant. It can, therefore, be seen how the above mentioned difficulty in transmission of the output signal results from the low signal level available and the fact that it is floating and not referenced to the zero-volt supply line. The latter problems might be overcome by using an oscillator circuit which saturates the core, and obtaining the output as a high-level square-wave with modulated pulse width, but a very large core is still required and the power consumption would be considerably higher.

It is the principal object of this invention to provide current measuring apparatus which functions on relatively low power consumption and which operates efficiently.

The invention in one general form, therefore, provides apparatus for measuring current flow in a conductor, comprising a magnetic core attachable about the conductor for induction of a magnetic flux therein when current flows in the conductor, said core being constructed with plural sections to provide a multiple path for the magnetic flux, an electrical oscillating circuit functioning to saturate at least part of one of said sections, and means for deriving from the waveform of oscillations of said oscillator a signal indicative of the value of current flowing in the conductor.

For a better understanding of the invention, reference will be made to the following description together with the accompanying drawings in which.

The present invention provides a pulse width modulated output and has the advantages of reasonably low power consumption with small core size. One additional advantage is that mating surfaces of the ferromagnetic core are never separated and exposed to dirt, or other extraneous matter, when the core is opened to introduce the conductor under test.

Figure 1:
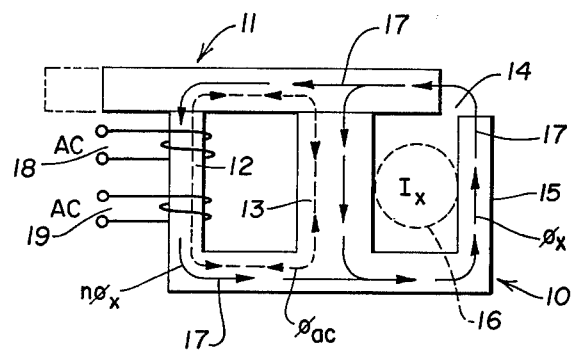
FIG. 1 illustrates one specific embodiment of a ferromagnetic core constructed in accordance with this invention.

With reference to FIG. 1, it will be observed that a small, easily saturated, "E" core 10 of ferrite material is used, with a sliding I-bar 11 which is held by spring pressure permanently in close contact with two limbs 12 and 13 of the E-core 10. A large, preset air-gap 14 is left in series with the third limb 15. The conductor 16 carrying the unknown current induces a unidirectional flux 17 in the third limb 15, which is limited by the size of the air-gap 14 so that it never saturates the core 10. This flux 17 is further divided between the large center leg 13 and the narrow leg 12 carrying the oscillator coils 18 and 19. The last leg 12 is alternately saturated in opposite directions by the oscillator (FIG. 2), but the large area of the center leg 13, and the air-gap 14 in the third leg 15, prevent these from also being saturated. The imbalance flux in the oscillator leg 12 causes an unequal mark-space ratio at the output of the circuit, and this is not dependent on applied voltage or other circuit parameters to any great degree, the overall calibration being controlled by the air-gap 14.

Figure 2:
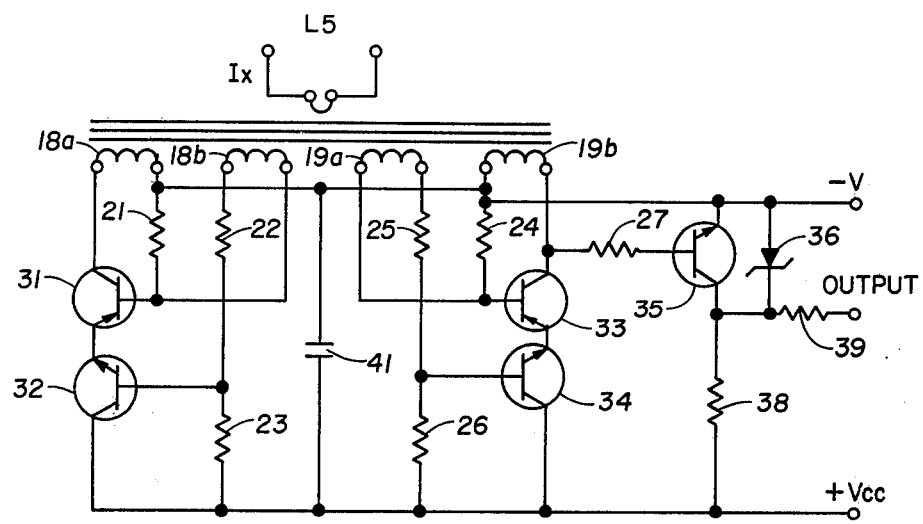
FIG. 2 is a schematic representation of a preferred form of electrical circuit to be utilized with the ferromagnetic core of FIG. 1.

The exciter circuit shown in FIG. 2, in some respects, resembles a conventional saturating core oscillator of the type normally used for power supply inverters. This portion of the circuit comprises the coils 18a, 18b, 19a and 19b, which are responsive to the magnetic field in the core, resistors 21 through 27, and transistors 31 and 33. The emitters of the latter would, in such a conventional saturating core oscillator, be grounded directly. However, in the present construction, complementary transistor switches 32 and 34 are added which avoid clipping of the voltage transient peaks (FIG. 3) as this would cause a loss of sensitivity. Such clipping would be the direct result from normal breakdown of the transistors 31 and 33 under reverse voltage condition. By the addition of transistors 32 and 34 a symmetrical switch is obtained.

The oscillator drives a simple transistor switch 35, which provides a 5V peak-to-peak square-wave output between its collector and emitter terminals, capable of being transmitted over a great distance, without loss of accuracy. A resistor 38 is connected between positive terminal Vcc and the collector of transistor 35. A d.c. signal can easily be received from such a transmitted signal using any one of a wide choice of circuits, depending upon the particular application.

Zener diode 36, resistor 39, and capacitor 41 provide protection against any transients which may be induced in the cable linking the probe to its associated instrument. Resistors 23 and 26 are necessary to provide bias current for transistors 32 and 34.

Figure 3:
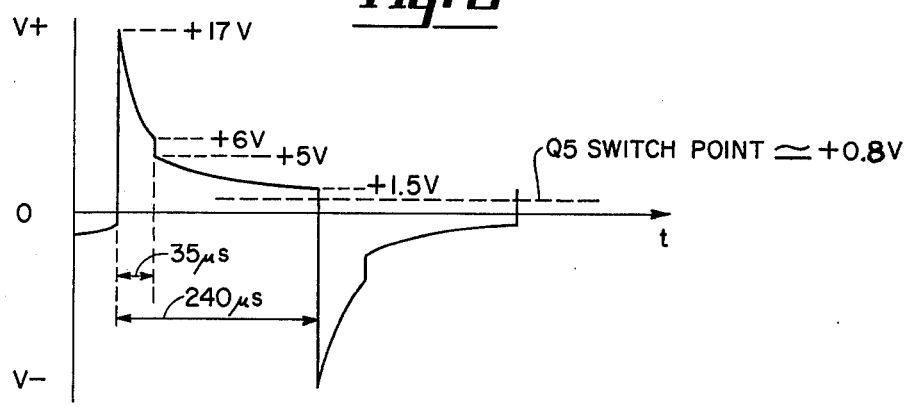
FIG. 3 shows a waveform to be derived at the collector of certain transistors of FIG. 2, under the condition where no current flows in the conductor under test.

FIG. 3 shows a typical waveform at the collectors of either transistor 31 or 33. In the circuit shown, the collector of transistor 33 is connected to the input of the transistor switch 35 although switch 35 could be connected to transistor 31. Where, as indicated by FIG. 3, the ratio of the integrated values of the peaks is substantially unity, no current is flowing in the conductor 16. The waveform peaks as shown and decays in a manner well-known in the functioning of D.C.-A.C. converters.

When current flows in the conductor under analysis, depending in sense upon the point of measurement connection in the oscilllator circuit, or the direction of current flow in the conductor, the ratio of the integrated values of the peaks of the waveform is other than unity. The value of the current flow will be revealed by this ratio. Therefore, the pulse on-off ratio at the output of the switch 35 provides an accurate indication of the value of the current flow in the conductor under analysis.

One simple manner is which this output may be indicated upon a linear scale of an ammeter would be to connect a potentiometer across the voltage supply and connect the output lead from the switch 35 through an ammeter to a center tap of the potentiometer. The meter would have zero calibration when the peak ratio is unity.

Whereas the foregoing description relates to measurement of a D.C. current in the conductor under analysis, it is also applicable to the measurement of an A.C. current providing the frequency thereof is low comparable with the frequency of the saturating oscillator. There are many applications for measuring apparatus of the present type, for example automotive electrical system analysers and D.C. or A.C. power distribution systems.

While I have shown a specific embodiment of my invention, it is to be understood that this is for purposes of illustration only and that the scope of the invention is limited solely by the appended claims.

I claim:

1. A current measuring device for measuring a current flowing in a conductor by inductive coupling to the conductor, said device comprising
   an E-shaped core of magnetic material having first and second outer legs and a center leg spaced from said second outer leg sufficiently to provide a space therebetween for the reception of a conductor carrying the current to be measured,
   a bar movably associated with said E-shaped core and movable between a first position in which the bar is displaced from the end of said second outer leg sufficiently to provide for the insertion of a conductor therein to a normal position in which it is in engagement with said first outer leg and said center leg but is displaced from said second outer leg by an air gap,
   a pair of windings disposed on said first outer leg,
   means for alternately energizing said windings to cause flux flow in opposite directions,
   and means for measuring any difference in voltage across said windings resulting from the effect of flux flowing in said center leg because of current flow in said conductor.

2. The current measuring device of claim 1 in which said bar is slidably associated with said E-shaped core and is in continuous slidable engagement with said first outer leg and said center leg.

3. The current measuring device of claim 2 in which said bar extends across the ends of said first outer leg and said center leg in slidable engagement with the ends of said leg.

4. The current measuring device of claim 1 in which the energization of each of said windings is controlled by a separate transistor connected in series therewith with means for alternately rendering said transistors conductive to cause alternate energization of said windings.

5. The current measuring device of claim 4 in which the means for causing said transistors to be alternately conductive comprises two additional windings inductively associated with said previously named windings and connected to control electrodes of said transistors.

6. The current measuring device of claim 4 in which each of said transistors has a further transistor in series therewith to prevent clipping of the voltage peaks resulting from the alternate energization of said windings.

7. The current measuring device of claim 4 in which the means for measuring any difference in voltage across said windings comprises a further transistor having a control electrode thereof connected to an output electrode of one of said previously named transistors.

8. A current measuring device for measuring a current flowing in a conductor by inductive coupling to the conductor, said device comprising
   a core of magnetic material having first and second legs,
   a bar movably associated with said core and movable between a first position in which the bar is displaced from the end of one of said legs sufficiently to provide for the insertion of a conductor into said core to a normal position in which it forms a substantial part of the magnetic path of said core,
   a pair of windings disposed on said first leg, means including a pair of transistors, each controlling the energization of one of said windings, to cause said windings to be alternately energized to cause flux flow in opposite directions,
   means responsive to the change in the magnetic field in the core including a pair of further transistors, one in series with each of the previously named transistors, to prevent clipping of the voltage peaks resulting from the alternate energization of said windings,
   and means for measuring any difference in voltage across said windings resulting from the effect of flux flowing in said first leg because of current flow in said conductor, said last named means comprising a further transistor having a control electrode thereof connected to one of said transistors of the first named pair of transistors.

* * * * *